(12) United States Patent
Bauer (10) Patent No.: US 7,728,698 B2
(45) Date of Patent: Jun. 1, 2010

(54) SURFACE ACOUSTIC WAVE RESONATOR FILTER WITH LONGITUDINALLY COUPLED TRANSDUCERS

(75) Inventor: Thomas Bauer, Munich (DE)

(73) Assignee: EPCOS AG, Munich (DE)

( * ) Notice: Subject to any disclaimer, the term of this patent is extended or adjusted under 35 U.S.C. 154(b) by 457 days.

(21) Appl. No.: 11/587,014

(22) PCT Filed: Apr. 6, 2005

(86) PCT No.: PCT/EP2005/003624

§ 371 (c)(1),
(2), (4) Date: Jul. 17, 2007

(87) PCT Pub. No.: WO2005/107065

PCT Pub. Date: Nov. 10, 2005

(65) Prior Publication Data

US 2007/0279157 A1    Dec. 6, 2007

(30) Foreign Application Priority Data

Apr. 22, 2004   (DE) .................. 10 2004 020 183

(51) Int. Cl.
*H03H 9/64*    (2006.01)
(52) U.S. Cl. ................................. 333/195; 333/196
(58) Field of Classification Search ............. 333/195, 333/196
See application file for complete search history.

(56) References Cited

U.S. PATENT DOCUMENTS

| | | |
|---|---|---|
| 3,582,840 A | 6/1971 | DeVries |
| 4,492,940 A | 1/1985 | Hikita |
| 5,694,096 A | 12/1997 | Ushiroku et al. |
| 5,770,985 A | 6/1998 | Ushiroku et al. |
| 6,420,946 B1 * | 7/2002 | Bauer et al. .................. 333/193 |
| 6,879,086 B2 * | 4/2005 | Takamine ............... 310/313 D |
| 7,042,132 B2 | 5/2006 | Bauer et al. |

(Continued)

FOREIGN PATENT DOCUMENTS

DE    198 18 038    11/1999

(Continued)

OTHER PUBLICATIONS

International Search Report for PCT/EP2005/003624, Jul. 1, 2005.

(Continued)

*Primary Examiner*—Benny Lee
*Assistant Examiner*—Alan Wong
(74) *Attorney, Agent, or Firm*—Fish & Richardson P.C.

(57) ABSTRACT

A surface acoustic wave filter includes an acoustic track bounded by reflectors, at least a first input transducer and at least a second input transducer acoustically coupled to the acoustic track that are connected in parallel and connected to an asymmetric input port, at least two first output transducers acoustically coupled to the acoustic track that are connected in parallel and connected, to a first terminal of a symmetric output port and at least two second output transducers acoustically coupled to the acoustic track that are connected in parallel and connected to a second terminal of a symmetric output port. Each first output transducer in the acoustic track and corresponding second output transducers are side-by-side and are electrically connected in series via a first bus bar.

35 Claims, 7 Drawing Sheets

U.S. PATENT DOCUMENTS

| | | | |
|---|---|---|---|
| 7,170,372 B2 | 1/2007 | Ruile et al. | |
| RE39,538 E | 4/2007 | Bauer et al. | |
| 7,304,553 B2 | 12/2007 | Bauer et al. | |
| 2003/0146805 A1* | 8/2003 | Sawada | 333/133 |
| 2004/0080385 A1* | 4/2004 | Takamine et al. | 333/195 |

FOREIGN PATENT DOCUMENTS

| | | |
|---|---|---|
| EP | 0 605 884 | 12/1993 |
| EP | 1 394 940 | 3/2004 |
| EP | 1 394 941 | 3/2004 |

OTHER PUBLICATIONS

Written Opinion for PCT/EP2005/003624, Jul. 1, 2005.
English translation of the Written Opinion for PCT/DE2005/003624, Jul. 1, 2005.
International Preliminary Report on Patentability in counterpart Application No. PCT/EP2005/003624, dated Nov. 14, 2006.
English Translation of International Preliminary Report on Patentability in counterpart Application No. PCT/EP2005/003624, dated Nov. 14, 2006.

* cited by examiner

SURFACE ACOUSTIC WAVE RESONATOR FILTER WITH LONGITUDINALLY COUPLED TRANSDUCERS

TECHNICAL FIELD

This patent application relates to a surface acoustic wave resonator filter (DMS filter, DMS=Double Mode Surface Acoustic Wave) with longitudinally coupled input and output transducers arranged in an acoustic track and having one asymmetric and one symmetric electric port.

BACKGROUND

A DMS filter with three transducers is disclosed in EP 1394940, where an electric port of the filter is symmetrized by a transducer divided into two partial transducers connected in series. The partial transducers have a common bus bar which is connected to ground via opposing bus bars of the transducer connected to the asymmetric electric port. A floating metal structure is provided in one of the transducers to compensate for the undesired asymmetry.

From FIG. 6 of the publication EP 0605884 A1, another symmetrical/asymmetrical DMS filter, with a total of seven transducers, is known, in which input and output transducers are arranged alternately: three parallel-connected input transducers are connected to an asymmetric electric input port, and each of two parallel-connected output transducers are connected to a terminal of a symmetric output port.

A symmetrical/asymmetrical DMS filter is known from FIG. 7 of EP 0605884, in which, in contrast to FIG. 6 of EP 0605884, the symmetrization of the input port is achieved by subdivision (vertical splitting, V-split) of the middle input port into two series-connected component transducers.

Additional DMS filters are known from the publications U.S. Pat. No. 3,582,840, U.S. Pat. No. 5,694,096, U.S. Pat. No. 5,770,985 and U.S. Pat. No. 4,492,940.

Reflector losses of a DMS filter can be reduced with an increasing number of transducers connected in parallel that are associated with an input or output port. On the other hand, however, the parasitic capacitances of the filter arrangement increase with the number of feed lines elements that are necessary to transducers, and matching at the input and output ports deteriorates accordingly. With the parallel connection of additional input and output transducers, the aperture of the acoustic track becomes smaller and could be unfavorable to maintain a given impedance level at the input or output port. In the transition from an arrangement with three transducers to an arrangement with six transducers, for instance, the aperture is reduced by a factor of two. Thereby, one obtains a reduction by a factor of two of the finger resistances, which increase proportionally to the aperture. The finger resistances are even reduced by a factor of four, since the transducers are connected in parallel. This is of advantage for HF (high-frequency) filters, where small finger heights and widths lead to large finger resistance losses. The aperture should not be reduced too much, however, because it is known that then transversal 2D (2D=two-dimensional) losses increase. A critical value for the minimum aperture is roughly $20\lambda$. The length of a filter increases from the use of larger numbers of transducers in the DMS track, one external ground connection such as one bond wire or one bump per transducer being necessary in case of additional transducers, which increases the surface area of the overall arrangement.

SUMMARY

A surface acoustic wave resonator filter with an acoustic track and longitudinally coupled input and output transducers in this track that has an asymmetric input and a symmetric electrical output is disclosed. The input transducers are connected in parallel with one another, and are connected to the signal terminal of the asymmetric electric port. The input transducers are each arranged between two parallel-connected output transducers that are connected to a corresponding terminal of the symmetric output port. Two centrally arranged serially interconnected output transducers together form a V-split transducer, of which the common bus bar for the two output transducers is connected on at least one side to the opposing ground track of the adjacent input transducer via at least one elongated electrode finger or metal strip (facing away from the center of the acoustic track).

The acoustic track is bounded by reflector structures to form a resonator structure. The filter has at least one first and at least one second input transducer that are electrically connected in parallel with one another and are connected to an asymmetric input port.

The filter additionally has at least two first output transducers connected in parallel with one another that are electrically connected to a first terminal of the symmetric output port, as well as at least two second output transducers connected in parallel with one another that are electrically connected to a second terminal of the symmetric output port.

Each first input transducer is arranged between two first output transducers. Each second input transducer is arranged between two second output transducers.

The filter may include a basic structure with a total of six transducers. The filter can also include more than six transducers. All transducers provided as input transducers are electrically connected to the signal terminal of the asymmetric port. All transducers arranged in one direction or in the direction of a reflector structure from the center of the filter that are provided as output transducers are electrically connected to the first signal terminal of the symmetric port. All transducers arranged opposite to the aforementioned direction from the center of the filter that are provided as output transducers are electrically connected to the second signal terminal of the symmetric port.

From the above-listed connection sequence of the transducers to the symmetric and asymmetric electric port, for all first input and output transducers, the distance between the centers of the outermost hot fingers facing one another is essentially an even number of half-wavelengths. The wavelength $\lambda$ is essentially related to the center frequency of the filter in the passband or corresponds to this frequency.

Electrode fingers that are at a potential other than ground or are connected to a signal path are referred to as hot fingers. Electrode fingers that are at ground potential are referred to as cold fingers.

The electrode units in a transducer can be arranged on a grid with a grid spacing of $\lambda/2$ and are alternately connected to the different potentials.

In a periodic, regular lattice formed by electrode fingers inside the first lattice stopband, the wavelength $\lambda$ of the acoustic wave is exactly equal to twice the finger spacing, measured from the finger centers.

The term lattice stopband refers to the frequency range in which the acoustic wave in the lattice is exponentially attenuated by wave components reflected from the electrode fingers, so that a standing wave is formed in the periodic lattice. For instance, a reflector with a high reflection factor can be operated effectively inside the stopband. Outside the stopband, the wave essentially passes through it.

For irregular lattices, the wavelength λ is determined as the mean of twice the finger spacing. That is, if L designates the distance between the centers of the first and last transducer fingers in the track, and NF represents the number of fingers contained in this area (including the first and the last electrode fingers), then the wavelength λ is defined as λ=2*L/(NF−1).

From the above-mentioned connection sequence of transducers to the symmetric and the asymmetric electrical port, it follows that for all second input and output transducers, the center-to-center finger spacing between the outermost opposing hot fingers is essentially an even number of half-wavelengths.

In some embodiments, the common bus bar of the centrally arranged output transducers can be electrically connected via a first connecting structure arranged between the first output transducer and the first input transducer to an opposing bus bar connected to ground of the adjacent input transducer. A second connecting structure can be arranged between the second output transducer and the second input transducer, and the first bus bar can be electrically connected via the second connecting structure to an opposing bus bar of the adjacent input transducer that is connected to ground.

It can be advantageous if both of the above conditions are satisfied in a filter arrangement.

The first and second connecting structure has at least one metal strip. The metal strips may be, for instance, elongated electrode fingers of a corresponding centrally arranged (first or second) output transducer. These fingers can also be associated with a subsequent (first or second) input transducer.

The first connecting structure may have an odd number of fingers, and the second connecting structure may have an even number of fingers.

The input transducers' terminally arranged fingers facing the center of the acoustic track can both be hot fingers. It is also possible, for one of these fingers to be at ground potential. The input transducers' terminally arranged fingers at ground potential facing the center of the acoustic track can be elongated and form the first or second connecting structure.

The filter disclosed here has the advantage of a good signal symmetry at the output port, low insertion loss and good impedance matching at the input and output ports.

By dividing a centrally arranged output transducer into two transducers, the impedance matching at the asymmetric filter input can also be improved compared to a filter with alternating arrangement of input and output transducers. One bump or bond wire for connecting the output transducer to ground may be saved. Because the bump and the electrical connections associated with it can be eliminated, parasitic capacitances may be decreased. The size of the component can also be reduced.

The electrode fingers of each individual transducer may be arranged essentially on a periodic grid in which the center-to-center finger spacing is roughly a half-wavelength. The periodicity of the finger arrangement in facing edges or transitional areas of adjacent transducers can be modified such that the center-to-center finger spacing is smaller in the peripheral area than in the center area of the transducer. A spatial offset between the center areas of two adjacent transducers can thereby be produced, which is the basis for the higher longitudinal modes that are necessary for operation of the DMS filter. The offset between the grids of the center areas of these transducers is typically about −λ/4. In addition, low bulk-wave losses can be produced in this area due to the smaller spacing of the finger centers in the peripheral area.

The bulk-wave losses can be further reduced if the center-to-center finger spacing in each of these two transducers is varied monotonically from the middle of a transducer towards the adjacent transducer and reaches its extreme value (e.g., the minimum value) at the boundary with the adjacent transducer. The finger widths can also be correspondingly adapted to the local finger spacing (see FIG. 11c).

The order of hot and cold fingers inside a transducer can be essentially periodic, i.e., hot and cold fingers alternate. For certain applications, it can also be advantageous to deviate from this order as part of a withdrawal weighting and to fold over individual fingers or connect to the opposing bus bar. With a favorable selection of folded-over fingers, the selection behavior of the filter can be improved.

In embodiments, the filter properties can be improved by using certain finger arrangements, such as an even or odd number of electrode fingers in the respective transducers, or by satisfying certain symmetry relationships.

With regard to the arrangement of hot and cold electrode fingers, the centrally arranged output transducers and the first and second output transducers can be mirror-symmetrical relative to one another (in relation to a vertical axis).

Embodiments are described below on the basis of associated figures. The figures show various embodiments on the basis of schematic representations not drawn to scale. Identical or identically acting parts are designated by identical reference characters.

DETAILED DESCRIPTION

Figure 1:
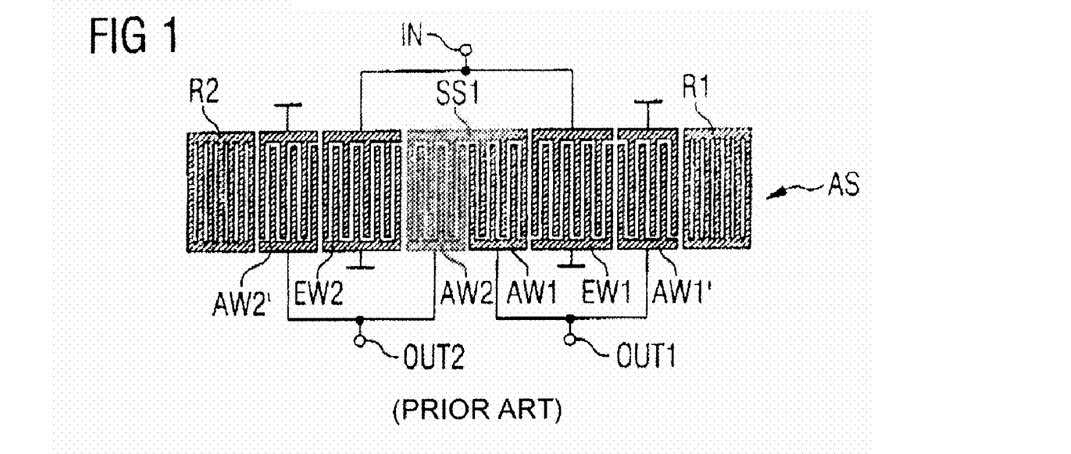
FIG. 1, an example of an asymmetrical/symmetrical DMS filter with six transducers in one acoustic track (prior art)

FIG. 1 shows an example of a DMS filter that has an acoustic track AS bounded by reflector structures R1 and R2.

The filter has an asymmetric input port IN and a symmetric output port with a first terminal OUT1 and a second terminal OUT2.

A basic structure that comprises a total of six transducers is arranged in the acoustic track.

A parallel circuit of a first input transducer EW1 and a second input transducer EW2 connected to ground is connected to the signal terminal of input port IN.

First output transducers AW1 and AW1' are connected to first terminal OUT 1 and second output transducers AW2 and AW2' are connected to second terminal OUT2 of the symmetric output port.

The centrally arranged first output transducer AW1 in the acoustic track and the correspondingly arranged second output transducer AW2 are side by side and are connected electrically in series to a common first bus bar SS1 and acoustically in opposite phase. In opposite phase means that, for the first and second output transducers, the spacing between the outermost hot fingers facing the other transducer is essentially an odd number of half-wavelengths (e.g. $\lambda/2$ or $3\lambda/2$).

First common bus bar SS1 for output transducers AW1 and AW2 is floating in this example; i.e., an indeterminate electrical potential can arise on SS1. The signal symmetry at the output port is thereby interfered with.

Figure 2:
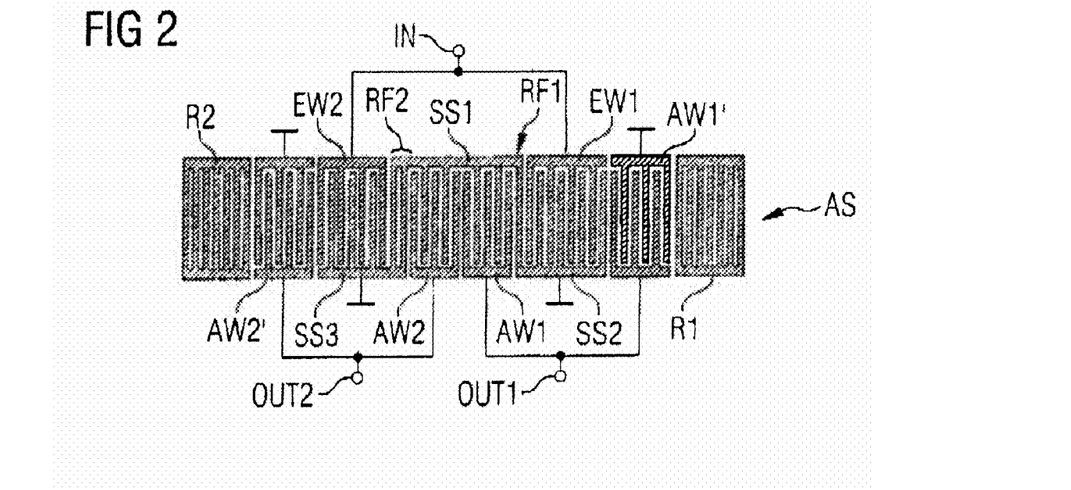
FIGS. 2 and 3, an asymmetrical/symmetrical DMS filter with six transducers in one acoustic track in each case, and the first bus bar connected to ground at both ends.

In FIG. 2, first bus bar SS1 is connected via a first connecting structure RF1 to a second bus bar SS2 of first input transducer EW1. First bus bar SS1 is additionally connected via a second connecting structure RF2 to a third bus bar SS3 of second input transducer EW2.

First connecting structure RF1 could be constructed as an elongated cold electrode finger. Second connecting structure RF2 could be constructed as two elongated electrode fingers.

The first and second connecting structures RF1, RF2 (particularly connecting structures with several electrode fingers) have a reflecting effect on an acoustic wave.

Spacing between the fingers is always understood in this application as the center-to-center spacing between fingers.

Spacing $a_1$ between the outermost hot fingers facing one another of the centrally arranged first output transducer and first input transducer is essentially $\lambda$, where $\lambda$ is a wavelength. The first connecting structure includes a metal strip that is formed as an elongated electrode arranged between these hot fingers.

Spacing $a_2$ between the outermost hot fingers facing one another of the centrally arranged second output transducer and second input transducer is essentially $3\lambda/2$. The second connecting structure includes two metal strips that are formed as an elongated electrode arranged between these hot fingers.

Output transducers AW1 and AW2 are connected in opposite phase in all embodiments of the application. In this example, the outermost mutually facing fingers of the centrally arranged first and second output transducers AW1 and AW2 are hot, that is to say, the spacing between the outermost mutually facing fingers of output transducers AW1 and AW2 is essentially $\lambda/2$.

The centrally arranged transducers—first and second output transducers AW1 and AW2—in FIG. 2 each has an even number of hot fingers. The total number of fingers is selected to be equal in both output transducers AW1 and AW2.

First and second input transducers EW1 and EW2 have an equal number N4 of hot fingers. The total number of fingers of input transducers EW1 and EW2 is different by one. First input transducer EW1 has one more (cold) finger than second input transducer EW2.

Terminally arranged output transducers AW1' and AW2' of the filter's basic structure may have an equal number N5 of hot fingers. The total number of fingers of these transducers could also be equal.

The terminally arranged finger in terminally arranged second output transducer AW2' facing second input transducer EW2 is a hot finger. The terminally arranged finger in second input transducer EW2 facing terminally arranged second output transducer AW2' is also a hot finger.

Figure 7:
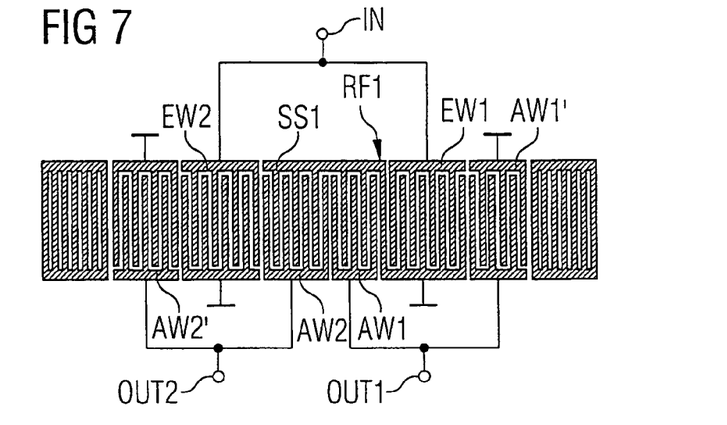
FIGS. 7-9, an additional filter in each that comprises a DMS track with six transducers.
Figure 8:
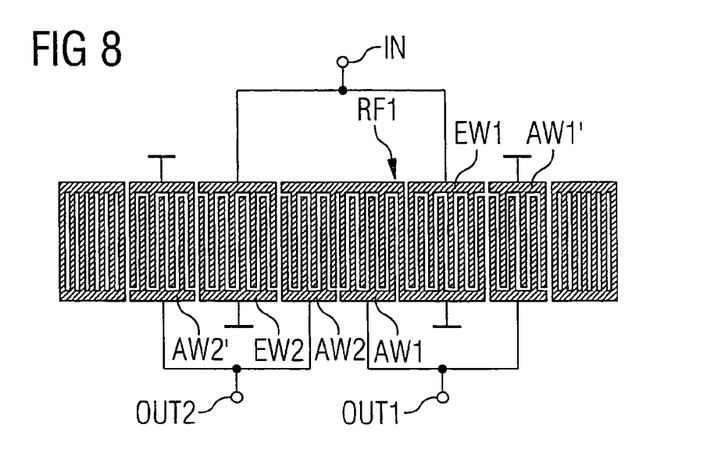

The fingers of terminally arranged output transducers AW1', AW2' that face the center of the acoustic track are both hot fingers in FIGS. 2-5. In FIGS. 7-8, the finger of first terminally arranged output transducer AW1' that faces the center of the acoustic track is a hot finger and the finger of second terminally arranged output transducer AW2' that faces the center of the acoustic track is a cold finger.

Figure 3:
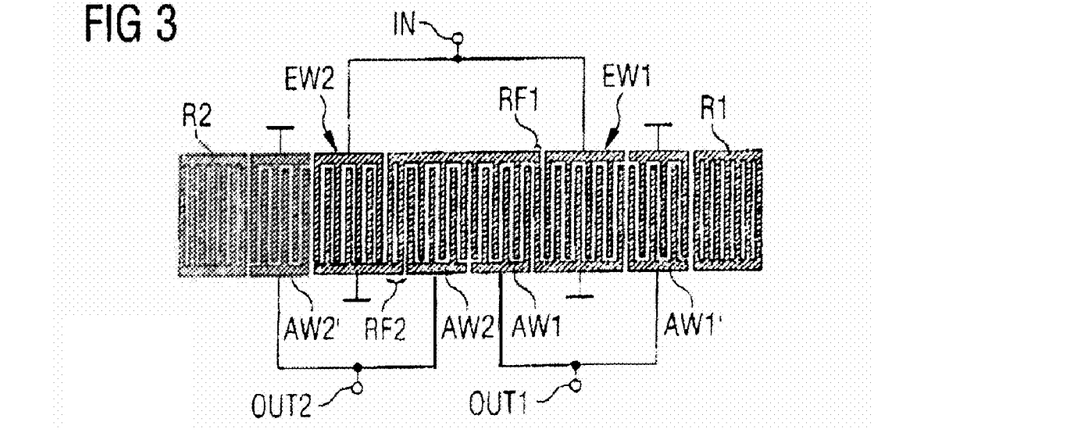
Figure 10:
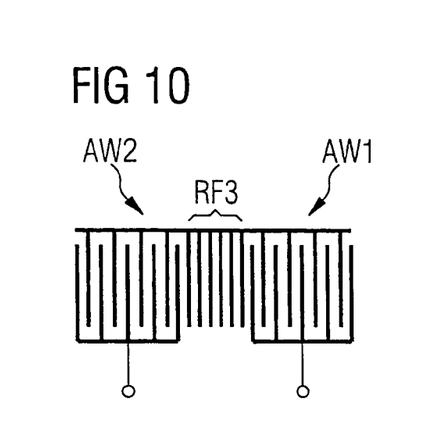
FIG. 10, one configuration of the centrally arranged output transducers.

In FIG. 3, the outermost mutually facing fingers of the centrally arranged first and second output transducers AW1 and AW2 are cold fingers, i.e., the spacing between the outermost facing hot fingers of output transducers AW1 and AW2 is essentially $3\lambda/2$. It is indicated in FIG. 10 that the spacing between the outermost facing hot fingers of output transducers AW1 and AW2 can also be a larger number of half-wavelengths—e.g. $7\lambda/2$ in FIG. 10. A reflector RF3 having an even number of cold electrode fingers is also arranged between the outermost facing hot fingers of output transducers AW1 and AW2. The reflector is connected to first bus bar SS1. On the opposite side, this reflector can be connected to ground.

Figure 4:
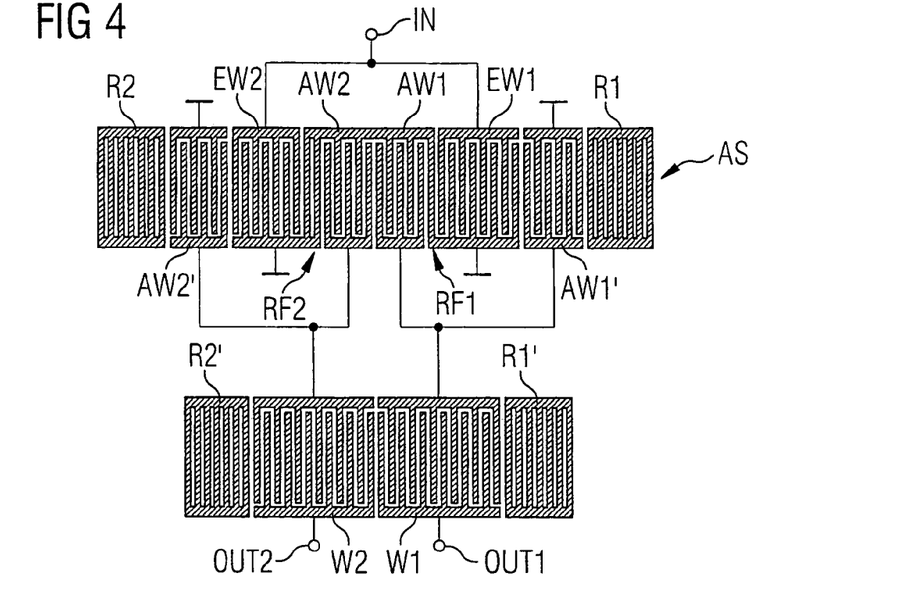
FIG. 4, a filter that comprises a DMS track according to FIG. 2 and a multiport resonator.

FIG. 4 shows a filter that has, alongside one acoustic track according to FIG. 2, an additional acoustic track downstream from the latter on the side of the symmetric output, bounded by reflector structures R1' and R2', and constructed as a multiport resonator.

A multiport resonator (e.g. a dual-port resonator) comprises two resonators R1' and R2' that are arranged side by side and transducers W1 and W2 that are acoustically coupled longitudinally, wherein each transducer W1 or W2 is arranged in a signal path of its own, or is connected in series in the respective signal path. Transducer W1 is connected on one side to first terminal OUT1 of the filter output and on the other to the parallel-connected first output transducers AW1 and AW1'. Transducer W2 is connected on one side to second terminal OUT2 of the filter output and on the other to the parallel-connected second output transducers AW2 and AW2'.

Transducers W1 and W2 are connected in opposite phase in the additional acoustic track.

Figure 5:
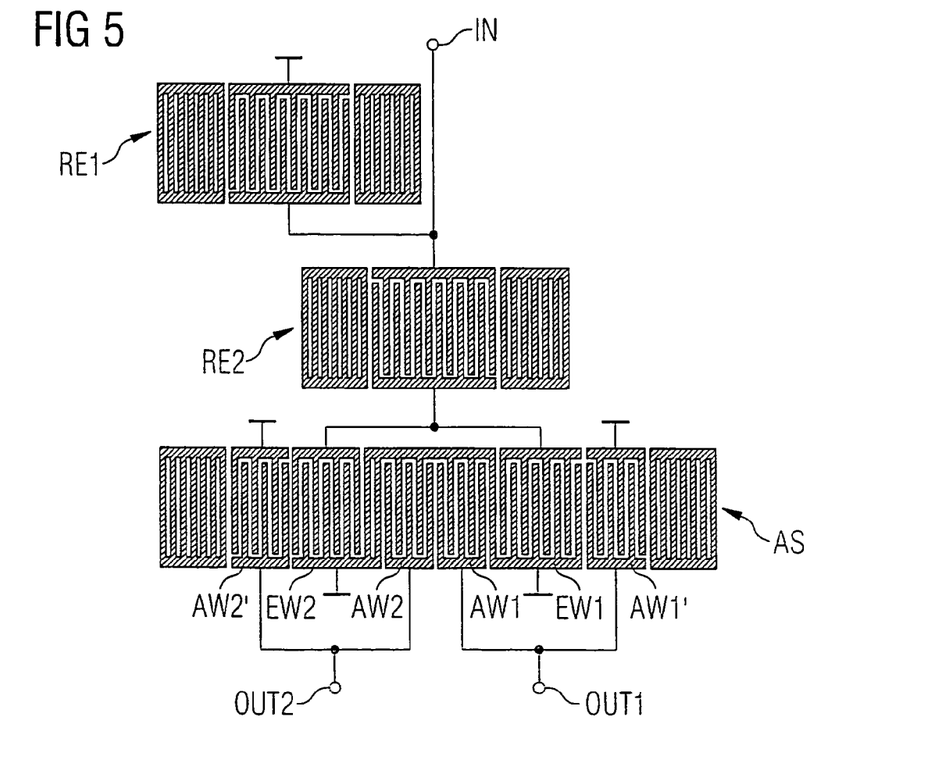
FIG. 5, a filter that comprises a DMS track according to FIG. 2 and a basic element of a ladder-type structure.

In FIG. 5, a ladder-type base element is connected upstream of the acoustic track according to FIG. 2, on the side of the asymmetric input. The ladder-type base element has a resonator RE2 arranged in the signal path and an additional resonator RE1 connecting this signal path to ground. Resonators RE1 and RE2 each has a transducer that is arranged between reflectors.

In the embodiment shown here, series resonator RE2 is connected downstream of parallel resonator RE1 in the signal path. In a base element, however, it is also possible for a parallel resonator to be connected downstream of a series resonator in the signal path. An arbitrary number of base elements is also possible. Series and parallel resonators can form arbitrary T and $\pi$ elements with one another that are inserted upstream of acoustic track AS.

FIGS. 6A through 6D show results of numeric simulation of electrical parameters of a known filter and of a invented filter according to FIG. 2.

Figure 6A:
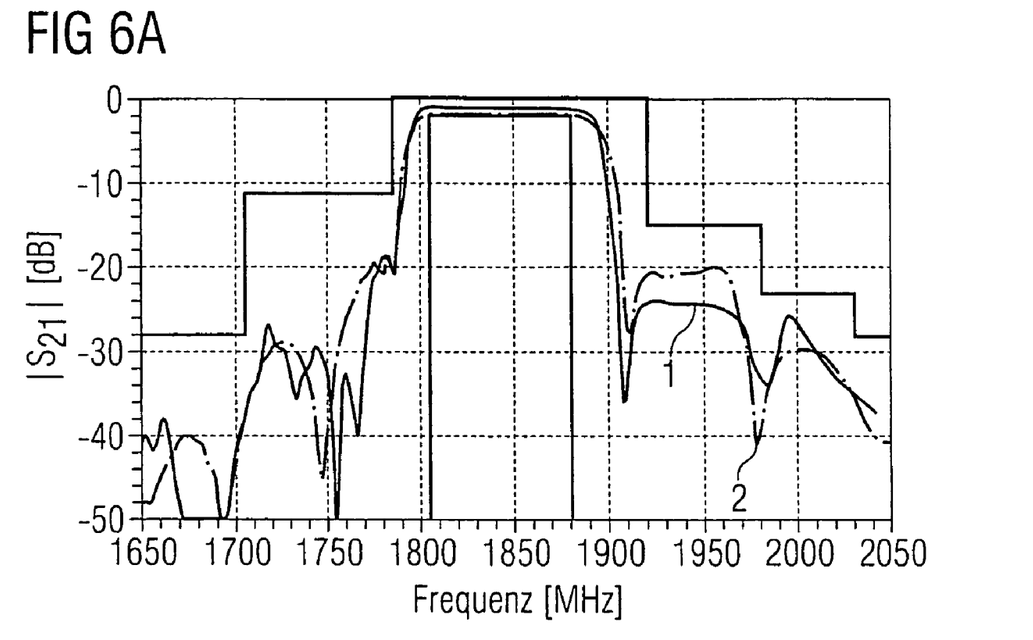
FIG. 6A, the transfer function of the filter of FIG. 4 compared to the transfer function of a filter of four transducers and one series resonator arranged on the input side.

FIG. 6A shows a numerically calculated transfer function 1 of the filter according to FIG. 4. $|S_{21}|$ is the absolute value of a corresponding scatter parameter $S_{21}$. This transfer function 1 is compared to a transfer function 2 of a DMS filter with a) an acoustic track with output transducers having a floating common bus bar, and b) a series resonator inserted upstream of the acoustic track on one side. This filter also comprises an output transducer subdivided into two component transducers connected in series.

The frequency selection of the filter according to FIG. 4 in the high-frequency cutoff band is around 1930.

Figure 6B:
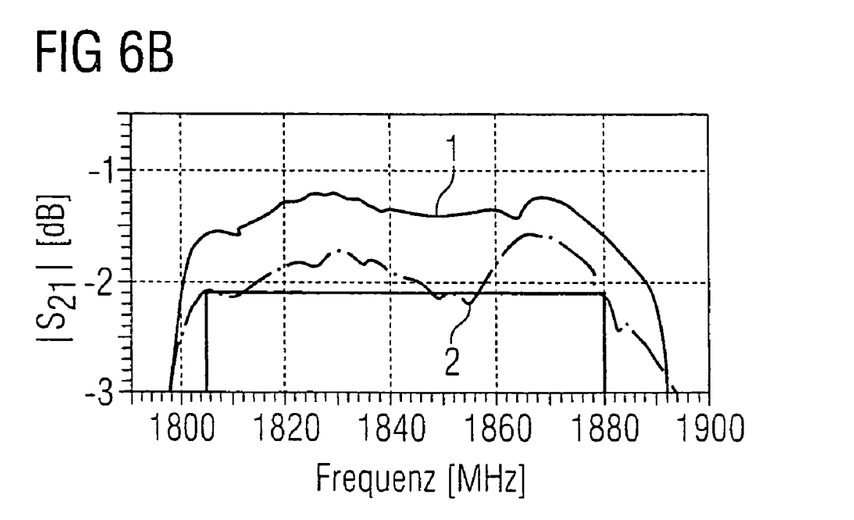
FIG. 6B, the expansion of the passband of the transfer function from FIG. 6A.

In FIG. 6B, the passband of transfer functions 1 and 2 is shown enlarged. The insertion loss of the filter according to the example shown in FIG. 4 is roughly 0.3 to 0.5 dB lower than that of the known filter.

Figure 6C:
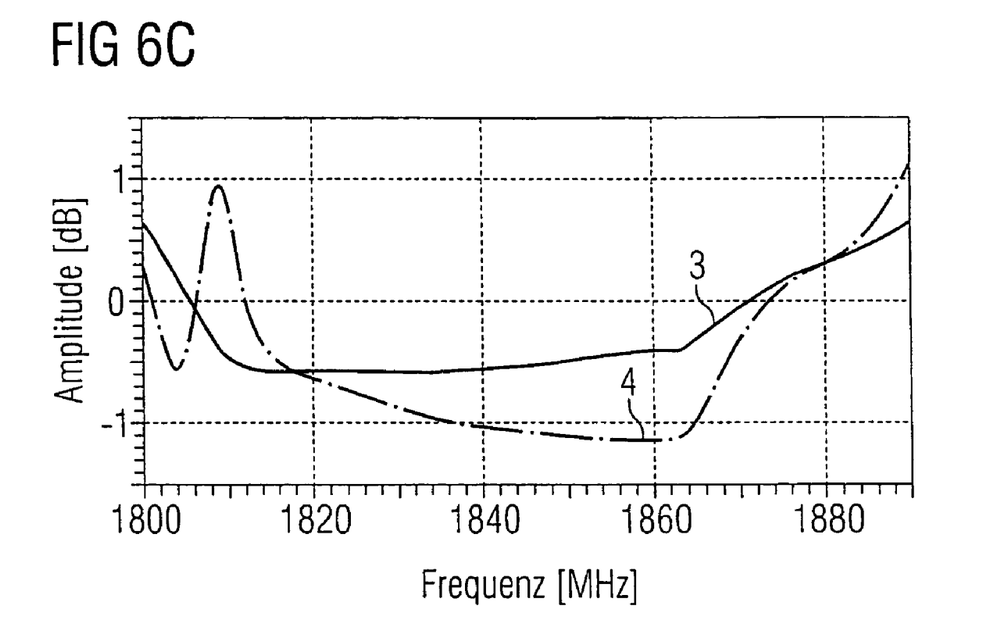
FIG. 6C, the amplitude differences between the terminals of the symmetric port of the filters of FIG. 2 and FIG. 1.
Figure 6D:
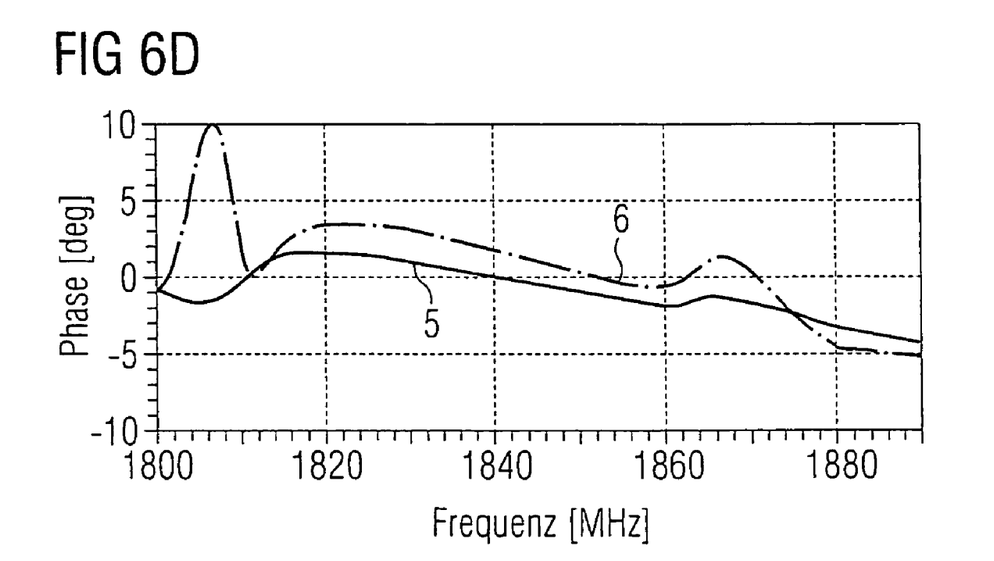
FIG. 6D, the phase differences between the terminals of the symmetric port of the filters of FIG. 2 and FIG. 1.

FIG. 6C shows an amplitude difference and FIG. 6D shows a phase difference (obtained by subtracting 180°) between terminals OUT1 and OUT2 of the symmetric ports.

Curves 3 and 5 each correspond to the filter according to FIG. 2 (i.e., with ground connection of first bus bar SS1). Curves 4 and 6 each correspond to the filter according to FIG. 1 (i.e., without ground connection of first bus bar SS1).

The components of a symmetric signal should be equally large in the passband and phase-shifted relative to one another by 180° (amplitude and phase symmetry). Therefore the amplitudes as well as the above-defined phase difference should ideally be zero. It is evident from FIGS. 6C and 6D that the filter according to the example shown in FIG. 4 has an improved symmetry of amplitude and phase.

Figure 9:
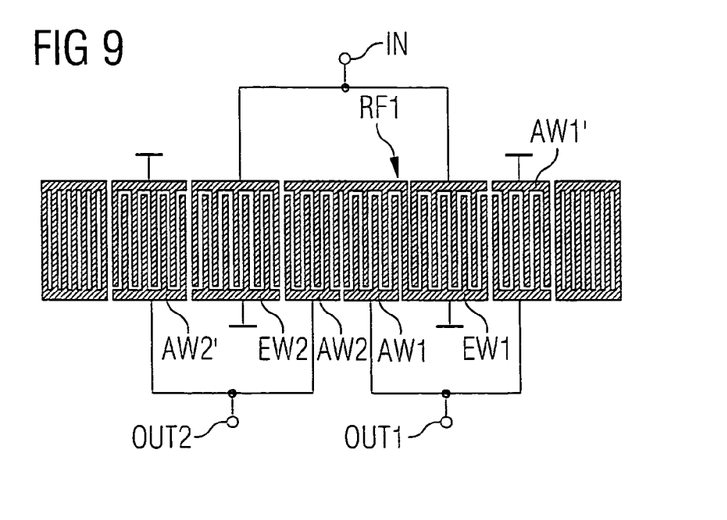

In the examples shown in FIGS. 7 through 9, first bus bar SS1 is electrically connected to ground or to second bus bar SS2 only on one side via first connecting structure RF1.

In the examples of FIGS. 7 through 9, spacing $a_2$ between the outermost facing hot electrodes of the centrally arranged second output transducer and second input transducer is essentially only $\lambda/2$. Spacing $a_1$ is essentially $\lambda$, as in FIG. 2.

The difference between spacings $a_1$ and $a_2$ may be selected to be $\lambda/2$ for amplitude and phase symmetry at the symmetric output port.

In FIG. 7, centrally arranged first output transducer AW1 has a number N3 of hot fingers, and centrally arranged second output transducer AW2 has a number N3'=N3+1 of hot fingers. The fingers of these transducers that face one another are hot. The difference in the total number of fingers for the two output transducers AW1 and AW2 is 2.

First and second input transducers EW1 and EW2 have an equal number N4 of hot fingers. The total number of fingers of input transducers EW1 and EW2 is also selected to be equal.

In this embodiment, terminally arranged output transducers AW1' and AW2' have an equal number N5 of hot fingers. The total number of fingers of these transducers differs by one. The total number of fingers of second output transducer AW2' is one more than that of first output transducer AW1'.

In all embodiments, the total number of fingers of the first and second terminally arranged output transducers can be selected to be equal or can differ by 1 or 2 (cold) fingers.

The filter shown in FIG. 8 differs from that of FIG. 7 in that here the centrally arranged output transducers AW1 and AW2 have an equal number of hot electrode fingers among one another, as well as an equal total number of fingers. The fingers facing one another in these transducers are cold fingers. With regard to their finger arrangement, centrally arranged output transducers AW1 and AW2 here are formed mirror-symmetrically relative to a vertical axis or to the center axis of acoustic track AS.

In FIGS. 7 and 8, mutually facing terminally arranged fingers of second input transducer EW2 and of terminally arranged output transducer AW2' are both cold fingers. The spacing between the outermost facing hot fingers of these transducers is essentially $3\lambda/2$.

In FIG. 9, fingers facing one another of second input transducer EW2 and terminally arranged output transducer AW2' are both hot fingers and the distance between them is essentially $\lambda/2$.

First input transducer EW1 in FIG. 9 has a number N4 of hot fingers, and second input transducer EW2 has a number N4'=N4+1 of hot fingers. The total number of fingers of input transducers EW1 and EW2 also differs by 1.

First terminally arranged output transducer AW1' in this embodiment has a number N2 of hot fingers. Second terminally arranged output transducer AW2' in this embodiment has a number N2'=N2+1 of hot fingers. The total number of fingers of these transducers differs by 2, and the total number of fingers of second output transducer AW2' exceeds that of first output transducer AW1' by 2.

Centrally arranged output transducers AW1 and AW2 are formed here as in FIG. 8.

Figure 11A:
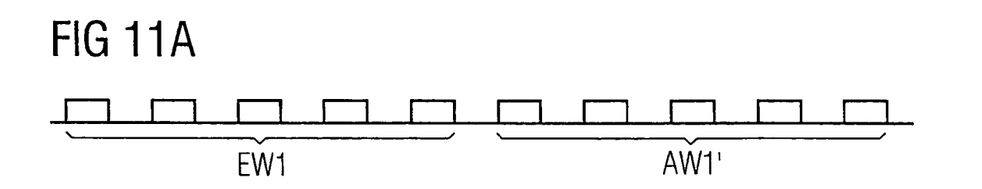
FIG. 11A, facing boundary areas of adjacent transducers, the fingers of which are arranged on a periodic grid.
Figure 11B:
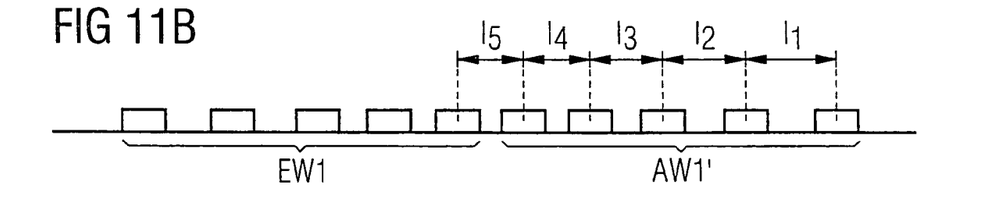
FIGS. 11B and 11C, facing boundary areas of adjacent transducers with a finger spacing in each that monotonically decreases towards the transducer boundary FIG. 12, an example of an asymmetrically/symmetrically operable DMS filter with eight transducers in one acoustic track.
Figure 11C:
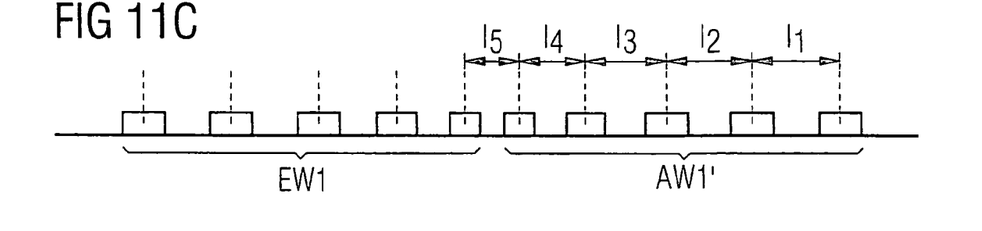

Transition regions (boundary regions) of the two transducers, in this embodiment, of first input transducer EW1 and terminally arranged first output transducer AW1' are shown in FIGS. 11A through 11C.

In FIG. 11A, the centers of the electrode fingers in the boundary areas of the two transducers are situated on a grid with a period of $\lambda/2$.

In FIG. 11B, the center-to-center finger spacings $1_1$ through $1_5$ are not equal to one another. The finger spacing decreases from $1_1$ to $1_5$, i.e., towards the edge of the respective transducer, and reaches its minimum at the transducer boundary. This reduction of finger spacing in the transitional area is referred to as chirp. The finger widths in FIG. 11B are selected to be equal, whereas the finger width in FIG. 11C decreases with the finger spacing. The metallization ratio (i.e., the ratio of metallized surface to total surface) remains constant in the respective transducer despite the reduction of finger width.

The metallization ratio in the DMS track of a filter according to the embodiments disclosed in the application may be between 0.65 and 0.75.

The spacing between the hot fingers is essentially $\lambda$. Slight deviations up to ca. 5% in the finger periodicity of different transducers are possible and could be advantageous in certain situations. Due to chirp, it is even possible for a deviation of $\lambda$ up to 15% to appear in the transition areas of the transducers.

Instead of the transducers EW1 and AW1' shown in FIGS. 11A through 11C, the above would also similarly apply to the adjacent transducers such as: AW1 and EW1, AW2 and AW1, EW2 and AW2, or AW2' and EW2.

Figure 12:
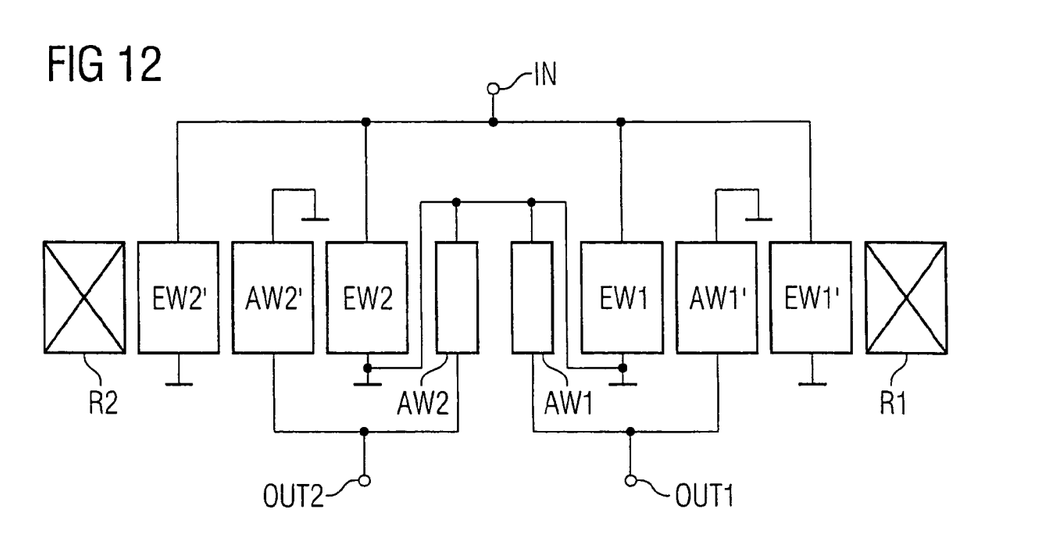

It is indicated in FIG. 12 that, alongside the basic structure of six transducers AW2', EW2, AW2, AW1, EW1 and AW1', a filter can also have additional transducers such as an additional first input transducer EW1' and an additional second input transducer EW2'.

All input transducers are connected to one another in parallel and to the signal terminal of input port IN.

In another embodiment, a first series resonator can be connected in series in the first signal path between first output transducers AW1, AW1' and first terminal OUT1 of the output, and a second series resonator can be connected in series in the second signal path between second output transducers AW2, AW2' and second terminal OUT2 of the output.

Figure 13:
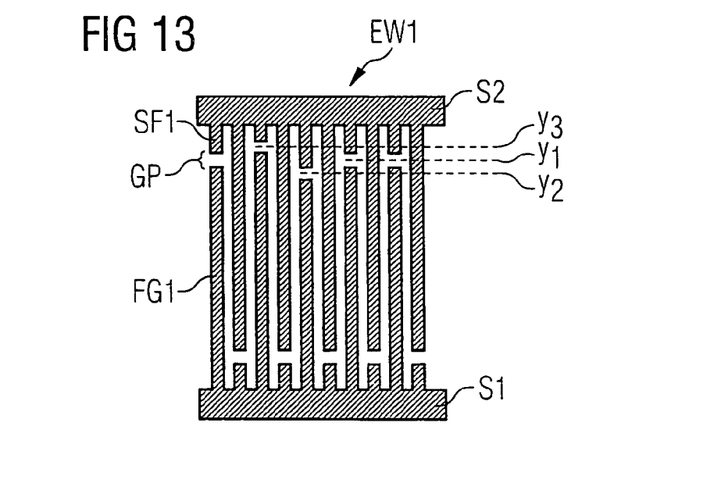
FIG. 13, a schematic section of a weighted filter.

It is indicated in FIG. 13 that for at least one of the transducers, input transducer EW1 for example, an electrode finger FG1 connected to the respective bus bar S1 opposes in the transversal direction a stub finger SF1 connected to the opposite bus bar S2. The length of the stub finger can be between $3\lambda/4$ and $3\lambda/2$.

The minimum spacing measured in the transversal direction (e.g. gap GP) between finger FG1 and the corresponding stub finger SF1 can be less than $\lambda/4$.

A transducer can be weighted, in which case the transversal position $y_1$ through $y_3$ of the centers of various gaps in the acoustic track or in the respective transducer is selected to be different. A transducer can also be withdrawal-weighted, in which case two excitation centers are omitted by interchanging the terminal sequence of an electrode finger. An excitation center corresponds to adjacent electrode fingers that have different electrode potentials.

The claims are not limited to the disclosed embodiments. The transducers may have split fingers, where several fingers at the same potential are provided for each half-wavelength. The input and the output of the filter can fundamentally be interchanged. The arrangements shown in the drawings can be horizontally or vertically mirrored.

One or both of the terminally arranged grounded fingers of terminally arranged output transducers AW1' and AW2' that are shown in the figures can be omitted.

In all embodiments, it is possible to eliminate the terminally arranged cold finger of a transducer at the boundary of two transducers and to associate it with the adjacent transducer.

The reflector structures can be at ground potential and, in particular, can be connected to the grounded bus bar of the respective terminally arranged transducer in the track.

In order to compensate for a phase difference from the ideal value, it is possible for a reflector to be provided between two arbitrarily selected transducers of acoustic track AS. The track can contain several reflectors inserted between different transducer pairs. Reflectors corresponding to one another could be inserted in the track symmetrically relative to the center point or center axis of the acoustic track.

Centrally arranged first and second output transducers may each have an even or an odd number of fingers.

The invention claimed is:

1. A surface acoustic wave filter comprising:
   an acoustic track bounded at both ends by reflector structures;
   one or more first input transducers and one or more second input transducers acoustically coupled to the acoustic track, connected in parallel, and connected to an asymmetric input port;
   at least two first output transducers acoustically coupled to the acoustic track, connected in parallel, and connected to a first terminal of a symmetric output port; and
   at least two second output transducers acoustically coupled to the acoustic track, connected in parallel, and connected to a second terminal of the symmetric output port;
   wherein each first input transducer is between two corresponding first output transducers, and each second input transducer is between two corresponding second output transducers;
   wherein one first output transducer in the acoustic track and one corresponding second output transducer are side-by-side and are electrically connected in series via a first bus bar;
   wherein, for each first input transducer and each first output transducer, a spacing between centers of outermost hot fingers facing one another is about an even number of half-wavelengths, and for each second input transducer and each second output transducer, a spacing between centers of outermost hot fingers facing one another is about an odd number of half-wavelengths;
   wherein at least one of the following conditions is satisfied:
   A) the first bus bar is electrically connected, via a first connecting structure between the one first output transducer and one first input transducer of the one or more first input transducers, to an opposing second bus bar of the one first input transducer, wherein the second bus bar is connected to ground; and
   B) the first bus bar is electrically connected, via a second connecting structure between the one second output transducer and one second input transducer of the one or more second input transducers, to an opposing third bus bar of the one second input transducer, wherein the third bus bar is connected to ground; and
   wherein the first and second connecting structures comprise at least one metal strip; and
   wherein (i) for the one or more second input transducers and centrally-arranged second output transducers, a spacing between centers of outermost hot fingers facing one another is about three half-wavelengths, and for the one or more second input transducers and terminally-arranged second output transducers, a spacing between outermost hot fingers facing one another is about a half wavelength; or (ii) for the one or more second input transducers and centrally-arranged second output transducers, the spacing between centers of outermost hot fingers facing one another is about a half-wavelength, and for the one or more second input transducers and terminally-arranged second output transducers, the spacing between outermost hot fingers facing one another is about three half-wavelengths.

2. The filter of claim 1, wherein the metal strip comprises an elongated electrode finger electrically connected to two bus bars.

3. A surface acoustic wave filter comprising:
   an acoustic track bounded at both ends by reflector structures;
   one or more first input transducers and one or more second input transducers acoustically coupled to the acoustic track, connected in parallel, and connected to an asymmetric input port;
   at least two first output transducers acoustically coupled to the acoustic track, connected in parallel, and connected to a first terminal of a symmetric output port; and
   at least two second output transducers acoustically coupled to the acoustic track, connected in parallel, and connected to a second terminal of the symmetric output port;
   wherein each first input transducer is between two corresponding first output transducers, and each second input transducer is between two corresponding second output transducers;
   wherein one first output transducer in the acoustic track and one corresponding second output transducer are side-by-side and are electrically connected in series via a first bus bar;
   wherein, for each first input transducer and each first output transducer, a spacing between centers of outermost hot fingers facing one another is about an even number of half-wavelengths, and for each second input transducer and each second output transducer, a spacing between centers of outermost hot fingers facing one another is about an odd number of half-wavelengths;
   wherein at least one of the following conditions is satisfied:
   A) the first bus bar is electrically connected, via a first connecting structure between the one first output transducer and one first input transducer of the one or more first input transducers, to an opposing second bus bar of the one first input transducer, wherein the second bus bar is connected to ground; and B) the first bus bar is electrically connected, via a second connecting structure between the one second output transducer and one second input transducer of the one or more second input transducers, to an opposing third bus bar of the one second input transducer, wherein the third bus bar is connected to ground; and wherein the first and second connecting structures comprise at least one metal strip;

wherein the at least one metal strip comprises an elongated electrode finger electrically connected to two bus bars; and wherein the first connecting structure has an odd number of metal strips comprising elongated electrode fingers.

4. A surface acoustic wave filter comprising:

an acoustic track bounded at both ends by reflector structures;

one or more first input transducers and one or more second input transducers acoustically coupled to the acoustic track, connected in parallel, and connected to an asymmetric input port;

at least two first output transducers acoustically coupled to the acoustic track, connected in parallel, and connected to a first terminal of a symmetric output port; and at least two second output transducers acoustically coupled to the acoustic track, connected in parallel, and connected to a second terminal of the symmetric output port;

wherein each first input transducer is between two corresponding first output transducers, and each second input transducer is between two corresponding second output transducers;

wherein one first output transducer in the acoustic track and one corresponding second output transducer are side-by-side and are electrically connected in series via a first bus bar;

wherein, for each first input transducer and each first output transducer, a spacing between centers of outermost hot fingers facing one another is about an even number of half-wavelengths, and for each second input transducer and each second output transducer, a spacing between centers of outermost hot fingers facing one another is about an odd number of half-wavelengths;

wherein at least one of the following conditions is satisfied:

A) the first bus bar is electrically connected, via a first connecting structure between the one first output transducer and one first input transducer of the one or more first input transducers, to an opposing second bus bar of the one first input transducer, wherein the second bus bar is connected to ground; and B) the first bus bar is electrically connected, via a second connecting structure between the one second output transducer and one second input transducer of the one or more second input transducers, to an opposing third bus bar of the one second input transducer, wherein the third bus bar is connected to ground; and wherein the first and second connecting structures comprise at least one metal strip;

wherein the at least one metal strip comprises an elongated electrode finger electrically connected to two bus bars; and wherein the second connecting structure has an even number of metal strips comprising elongated electrode fingers.

5. The filter of claim 3 or 4, wherein for all adjacent first input and output transducers, a spacing between centers of outermost hot fingers facing one another is about two half-wavelengths.

6. The filter of claim 3 or 4, wherein for all adjacent second input and output transducers, a spacing between centers of outermost hot fingers facing one another is about a half-wavelength.

7. The filter of claim 3 or 4, wherein the acoustic track is coupled to at least two first output transducers, at least two second output transducers, at least one first input transducer of the one or more first input transducers and at least one second input transducer of the one or more second input transducers.

8. The filter of claim 7, wherein a first output transducer of the at least two first output transducers comprises one less hot finger than a second output transducer of the at least two second output transducers.

9. The filter of claim 7, wherein at least one of the one or more first input transducers and the at least one of the one or more second input transducers has an equal number of hot fingers.

10. The filter of claim 9, wherein fingers of different output transducers that face one another are cold fingers.

11. The filter of claim 3 or 4, wherein at least one first input transducer of the one or more first input transducers comprises one less hot finger than at least one second input transducer of the one or more second input transducers.

12. The filter of claim 3 or 4, wherein terminally arranged fingers of terminally arranged first and second output transducers that face a center of the acoustic track comprise both hot fingers or both cold fingers.

13. The filter of claim 3 or 4, wherein a terminally arranged finger of a terminally arranged first output transducer that faces a center of the acoustic track is a hot finger, and a terminally arranged finger of a terminally arranged second output transducer that faces the center of the acoustic track is a cold finger.

14. The filter of claim 3 or 4, wherein terminally arranged output transducers have an equal number of hot fingers.

15. The filter of claim 3 or 4, wherein centrally arranged first and second output transducers have an equal number of hot fingers.

16. The filter of claim 15, wherein the centrally arranged first and second output transducers each has an even number of fingers.

17. The filter of claim 15, wherein the centrally arranged first and second output transducers each has an odd number of fingers.

18. The filter of claim 3 or 4, wherein a centrally arranged first output transducer comprises one less hot finger than a centrally arranged second output transducer.

19. The filter of claim 3 or 4, wherein, for a centrally arranged first output transducer and a centrally arranged second output transducer, terminally arranged fingers facing one another are hot fingers.

20. The filter of claim 3 or 4, wherein, for a centrally arranged first output transducer and a centrally arranged second output transducer, terminally arranged fingers facing one another are cold fingers.

21. The filter of claim 3 or 4, wherein a finger of a terminally arranged first output transducer facing a center of the acoustic track is a hot finger, and a finger of a terminally arranged second output transducer facing the center of the acoustic track is a cold finger.

22. The filter of claim 3 or 4, wherein a terminally arranged finger of a terminally arranged second output transducer facing at least one second input transducer of the one or more second input transducers is a cold finger, and a terminally arranged finger of the at least one second input transducer of the one or more second input transducers facing the terminally arranged second output transducer is a cold finger.

23. The filter of claim 3 or 4, wherein a terminally arranged finger of a terminally arranged second output transducer facing at least one second input transducer of the one or more second input transducers is a hot finger, and a terminally arranged finger of the at least one second input transducer of the one or more second input transducers facing the terminally arranged second output transducer is a hot finger.

24. The filter of claim 3 or 4, wherein two adjacent transducers arranged side-by-side defines a transition area, and a center-to-center finger spacing in the transition area is smaller than a maximum center-to-center finger spacing of the two adjacent transducers.

25. The filter of claim 24, wherein center-to-center finger spacings of the two adjacent transducers decrease from a center of one transducer towards a corresponding adjacent transducer and reach a minimum center-to-center finger spacing at a boundary of the two adjacent transducers.

26. The filter of claim 3 or 4, wherein terminally arranged fingers of at least one first input transducer of the one or more first input transducers and at least one second input transducer of the one or more second input transducers facing a center of the acoustic track are both hot fingers.

27. The filter of claim 3 or 4, wherein in at least one of the transducers, an electrode finger connected to a bus bar is opposed in a transverse direction by a stub finger connected to an opposite bus bar, and a length of the stub finger is between $3\lambda/4$ and $3\lambda/2$.

28. The filter of claim 27, wherein a minimum spacing, measured in the transverse direction, between a finger and a corresponding stub finger is less than $\lambda/4$.

29. The filter of claim 3 or 4, further comprising an additional acoustic track for a dual-port resonator, wherein the dual-port resonator comprises a first transducer and a second transducer that are longitudinally coupled to one another;
wherein a first transducer of the dual-port resonator is connected in series between the first output transducers and the first terminal of the output port, and a second transducer of the dual-port resonator is connected in series between the second output transducers and the second terminal of the output port.

30. The filter of claim 3 or 4, further comprising a first series resonator in series between the first output transducers and the first terminal of the output port and a second series resonator in series between the second output transducers and the second terminal of the output port.

31. The filter of claim 3 or 4, further comprising a series resonator in series between the input port and input transducers.

32. The filter of claim 3 or 4, further comprising a parallel resonator between the input port and input transducers.

33. The filter of claim 3 or 4, wherein the input port and the output port are interchangeable.

34. A surface acoustic wave filter comprising:
an acoustic track bounded at both ends by reflector structures;
one or more first input transducers and one or more second input transducers acoustically coupled to the acoustic track, connected in parallel, and connected to an asymmetric input port;
at least two first output transducers acoustically coupled to the acoustic track, connected in parallel, and connected to a first terminal of a symmetric output port; and
at least two second output transducers acoustically coupled to the acoustic track, connected in parallel, and connected to a second terminal of the symmetric output port;
wherein each first input transducer is between two corresponding first output transducers, and each second input transducer is between two corresponding second output transducers;
wherein one first output transducer in the acoustic track and one corresponding second output transducer are side-by-side and are electrically connected in series via a first bus bar;
wherein, for each first input transducer and each first output transducer, a spacing between centers of outermost hot fingers facing one another is about an even number of half-wavelengths, and for each second input transducer and each second output transducer, a spacing between centers of outermost hot fingers facing one another is about an odd number of half-wavelengths;
wherein at least one of the following conditions is satisfied:
A) the first bus bar is electrically connected via a first connecting structure between the one first output transducer and one first input transducer of the one or more first input transducers, to an opposing second bus bar of the one first input transducer, wherein the second bus bar is connected to ground; and
B) the first bus bar is electrically connected, via a second connecting structure between the one second output transducer and one second input transducer of the one or more second input transducers, to an opposing third bus bar of the one second input transducer, wherein the third bus bar is connected to ground; and
wherein the first and second connecting structures comprise at least one metal strip;
wherein the surface acoustic wave filter further comprises a reflector with an even number of fingers arranged between centrally arranged first and second output transducers.

35. The filter of claim 34, wherein the reflector is connected to the first bus bar.

* * * * *

UNITED STATES PATENT AND TRADEMARK OFFICE
CERTIFICATE OF CORRECTION

PATENT NO. : 7,728,698 B2  Page 1 of 1
APPLICATION NO. : 11/587014
DATED : June 1, 2010
INVENTOR(S) : Thomas Bauer It is certified that error appears in the above-identified patent and that said Letters Patent is hereby corrected as shown below:

Cover Page, item [57] column 2, Abstract, Line 7:
Delete "connected," and Insert --connected--

Cover Page, item [57] column 2, Abstract, Line 8:
Delete "port" and Insert --port,--

Column 10, Claim 1, Lines 24-25:
Delete "half wavelength;" and Insert --half-wavelength;--

Column 12, Claim 9, Line 20:
Delete "the" before "at least"

Column 14, Claim 34, Line 33:
Delete "connected" and Insert --connected,--

Signed and Sealed this

Twenty-eighth Day of September, 2010

David J. Kappos
*Director of the United States Patent and Trademark Office*